United States Patent
Ishii et al.

(10) Patent No.: US 12,288,676 B2
(45) Date of Patent: Apr. 29, 2025

(54) STAGE AND SUBSTRATE PROCESSING APPARATUS

(71) Applicant: Tokyo Electron Limited, Tokyo (JP)

(72) Inventors: Takayuki Ishii, Miyagi (JP); Kazuya Nagaseki, Miyagi (JP); Michishige Saito, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 187 days.

(21) Appl. No.: 17/337,696

(22) Filed: Jun. 3, 2021

(65) Prior Publication Data

US 2021/0391153 A1   Dec. 16, 2021

(30) Foreign Application Priority Data

Jun. 15, 2020   (JP) ................................. 2020-103142

(51) Int. Cl.
*H01J 37/32*   (2006.01)
*H01L 21/683*   (2006.01)
*H01L 21/687*   (2006.01)

(52) U.S. Cl.
CPC .. *H01J 37/32724* (2013.01); *H01L 21/68757* (2013.01); *H01J 2237/2007* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 6,037,066 A | * | 3/2000 | Kuwabara | B22F 7/008 361/708 |
| 6,538,872 B1 | * | 3/2003 | Wang | H01L 21/6833 361/103 |
| 8,007,591 B2 | * | 8/2011 | Hamelin | C23C 16/46 156/345.52 |
| 8,279,577 B2 | * | 10/2012 | Nguyen | H01L 21/6875 361/230 |
| 2007/0210037 A1 | * | 9/2007 | Ishida | H01J 37/32009 219/121.43 |
| 2012/0248715 A1 | * | 10/2012 | Kondo | H01L 21/6833 279/128 |

(Continued)

FOREIGN PATENT DOCUMENTS

| | | |
|---|---|---|
| JP | H10-041377 | 2/1998 |
| JP | 2002-110774 | 4/2002 |

(Continued)

OTHER PUBLICATIONS

Wikipedia entry for diffusion bonding. https://en.wikipedia.org/wiki/Diffusion_bonding Accessed May 21, 2024. (Year: 2024).*

*Primary Examiner* — Parviz Hassanzadeh
*Assistant Examiner* — Tiffany Z Nuckols
(74) *Attorney, Agent, or Firm* — IPUSA, PLLC

(57) ABSTRACT

A stage includes a first member made of a material having a density of 5.0 g/cm³ or less, and a second member joined to the first member. The second member is made of a material having a linear expansion coefficient of 5.0×10⁻⁶/K or less and a thermal conductivity of 100 W/mK or more. A flow passage for a temperature control medium is formed in at least one of the first member and the second member.

8 Claims, 8 Drawing Sheets

(56) References Cited

U.S. PATENT DOCUMENTS

2015/0129165 A1* 5/2015 Parkhe ............. H01L 21/67109
165/67
2015/0232983 A1* 8/2015 West .................. H01J 37/3244
165/104.34

FOREIGN PATENT DOCUMENTS

JP       2018-006737      1/2018
JP       2019-201086    11/2019

* cited by examiner

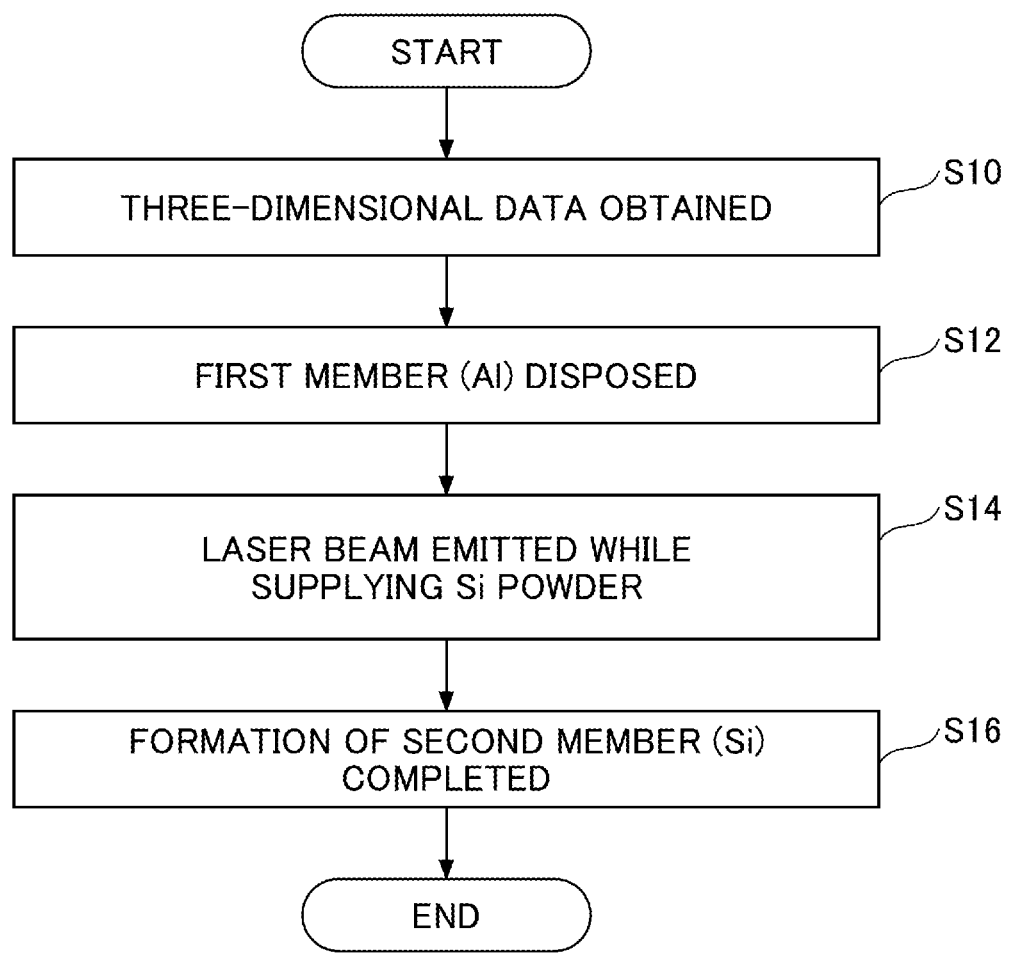

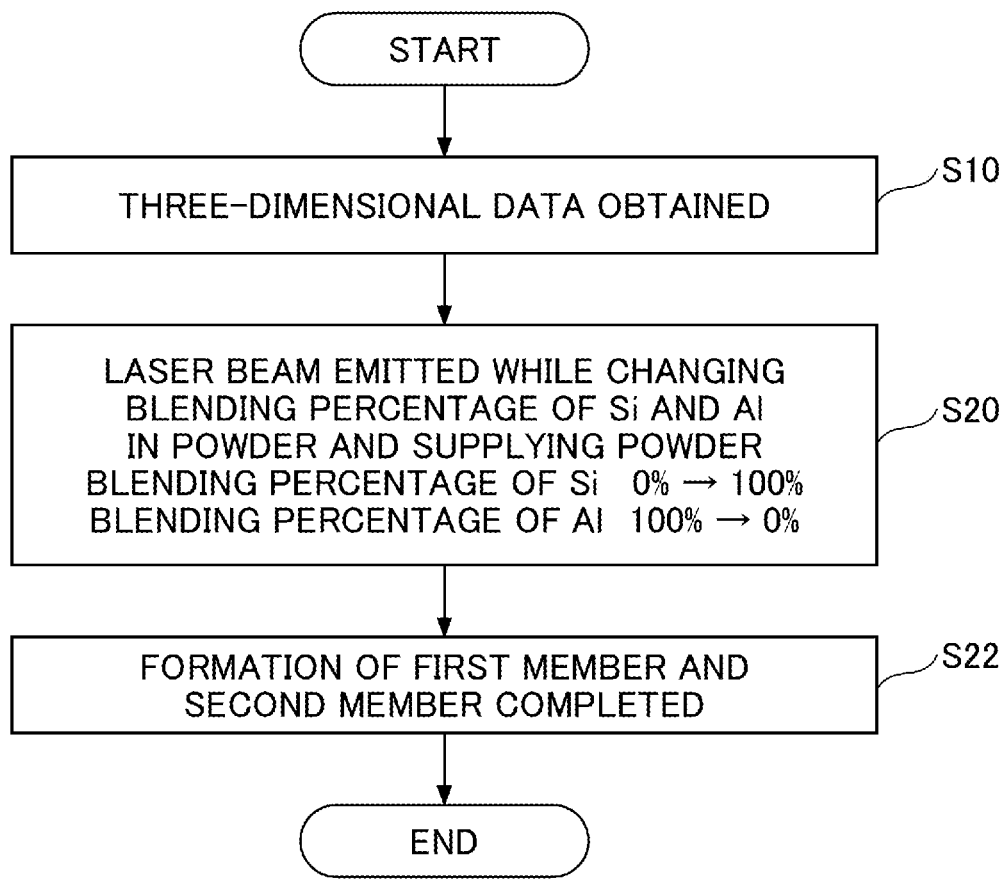

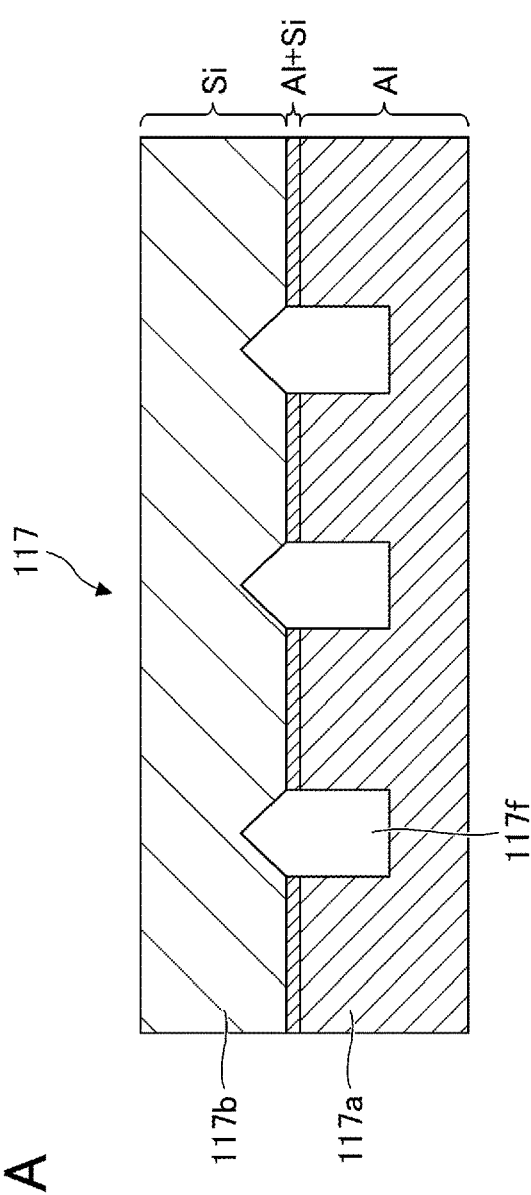
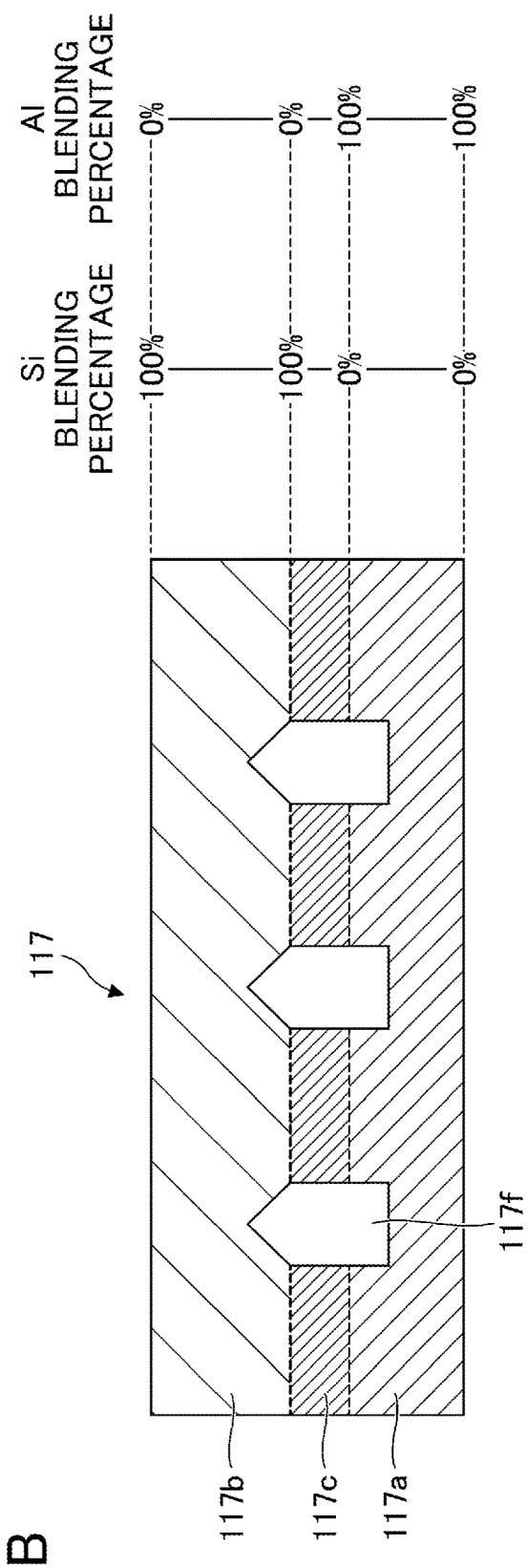
FIG.7A
FIG.7B

STAGE AND SUBSTRATE PROCESSING APPARATUS

CROSS-REFERENCE TO RELATED APPLICATION

The present application is based on and claims priority to Japanese Priority Application No. 2020-103142 filed on Jun. 15, 2020, the entire contents of which are hereby incorporated herein by reference.

BACKGROUND OF THE INVENTION

1. Field of the Invention

The present disclosure relates to a stage and a substrate processing apparatus.

2. Description of the Related Art

For example, Japanese Patent Application Laid-Open No. 2019-201086 discloses a stage including a base and an electrostatic chuck. The base is formed of, for example, aluminum, titanium and the like. A cooling flow passage is formed inside the base.

SUMMARY OF THE INVENTION

The present disclosure provides a stage that has a preferable thermal conductivity, a low linear expansion coefficient, and a lightweight.

According to one embodiment of the present disclosure, there is provided a stage including a first member made of a material having a density of 5.0 g/cm$^3$ or less, and a second member joined to the first member. The second member is made of a material having a linear expansion coefficient of $5.0 \times 10^{-6}$/K or less and a thermal conductivity of 100 W/mK or more. A flow passage for a temperature control medium is formed in at least one of the first member and the second member.

BRIEF DESCRIPTION OF THE DRAWINGS

FIG. 5 is a flowchart illustrating a first method for manufacturing a base according to an embodiment;

FIG. 6 is a flowchart illustrating a second method for manufacturing a base according to an embodiment;

FIGS. 7A and 7B are diagrams schematically illustrating a base shaped using first and second manufacturing methods according to an embodiment.

DETAILED DESCRIPTION OF THE PREFERRED EMBODIMENTS

Figure 1:
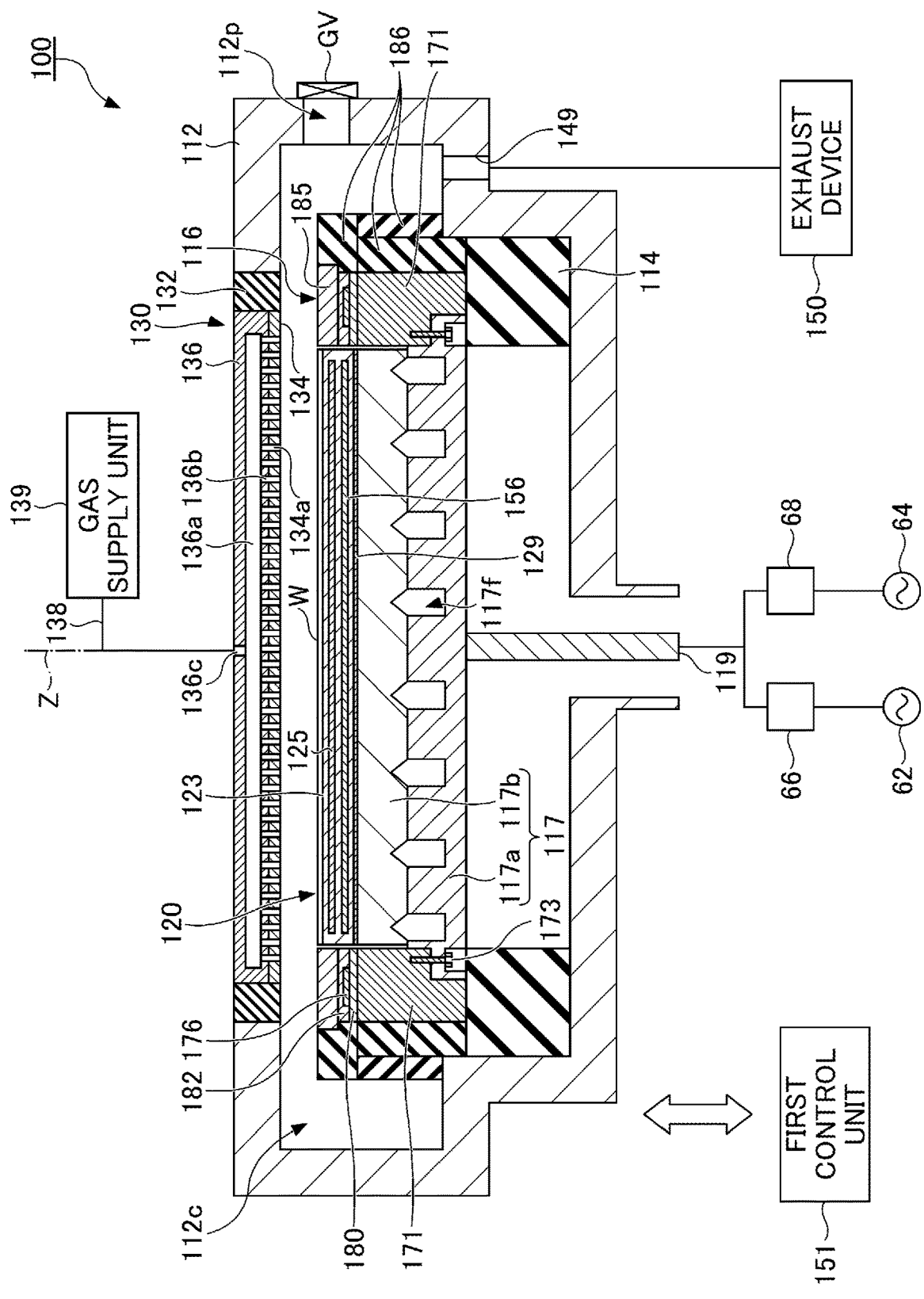
FIG. 1 is a schematic cross-sectional view illustrating an example of a substrate processing apparatus according to an embodiment.

Hereinafter, embodiments of the present disclosure will be described in detail with reference to the drawings. In each drawing, the same components are indicated by the same reference numerals and overlapping descriptions may be omitted.

[Substrate Processing Apparatus]

To begin with, a substrate processing apparatus 100 including a stage according to an embodiment will be described with reference to FIG. 1. FIG. 1 is a cross-sectional view illustrating an example of a substrate processing apparatus 100 according to an embodiment. The substrate processing apparatus 100 is a capacitively coupled plasma processing apparatus.

The substrate processing apparatus 100 includes a processing vessel 112 and a stage 116. The processing vessel 112 has an approximately cylindrical shape and provides an inner space therein as a processing chamber 112c. The processing vessel 112 is, for example, made of aluminum. A ceramic film, such as an aluminum film and/or an yttrium oxide film, is formed on the surface of the processing vessel 112 on the inner space side. The processing vessel 112 is grounded. In the side wall of the processing vessel 112, an opening 112p is formed for carrying a wafer W into the processing chamber 112c and carrying the wafer W out of the processing chamber 112c. The opening 112p can be opened and closed by a gate valve GV.

The stage 116 is configured to support a wafer W in the processing chamber 112c. The stage 116 has functions of adsorbing a wafer W with an electrostatic chuck 120, adjusting the temperature of the wafer W, and transmitting high frequency power to a base 117. The base 117 includes a first member 117a and a second member 117b. Details of the stage 116 will be described later.

The substrate processing apparatus 100 includes an upper electrode 130. The upper electrode 130 is disposed within an upper opening of the processing vessel 112 and is disposed approximately parallel to the stage 116 that serves as a lower electrode. An insulating support member 132 is interposed between the upper electrode 130 and the processing vessel 112.

The upper electrode 130 includes a ceiling plate 134 and a support 136. The ceiling Plate 134 has an approximately disk shape. The ceiling plate 134 may be electrically conductive. The ceiling plate 134 is, for example, formed of silicon or aluminum, with a plasma resistant ceramic film on its surface. A plurality of gas discharge holes 134a is formed in the ceiling plate 134. The gas discharge hole 134a substantially extends in the vertical direction.

The support 136 removably supports the ceiling plate 134. The support 136 is formed of, for example, aluminum. A gas diffusion chamber 136a is formed in the support 136. A plurality of holes 136b communicating with the plurality of gas discharge holes 134a extends from the gas diffusion chamber 136a. A pipe 138 is connected to the gas diffusion chamber 136a via a port 136c. A gas supply unit 139 is connected to the pipe 138.

The substrate processing apparatus 100 includes an exhaust device 150. The exhaust device 150 includes one or more pumps such as a turbomolecular pump and a dry pump, and a pressure regulating valve. The exhaust device 150 is connected to an exhaust port 149 formed in the processing vessel 112.

The substrate processing apparatus 100 includes a first control unit 151. The storage unit of the first control unit 151 stores a control program and recipe data for controlling various processes executed by the substrate processing apparatus 100 using a processor. For example, the storage unit of the first control unit 151 stores a control program and recipe data for executing a Plasma process such as an etching process using the substrate processing apparatus 100.

Figure 2:
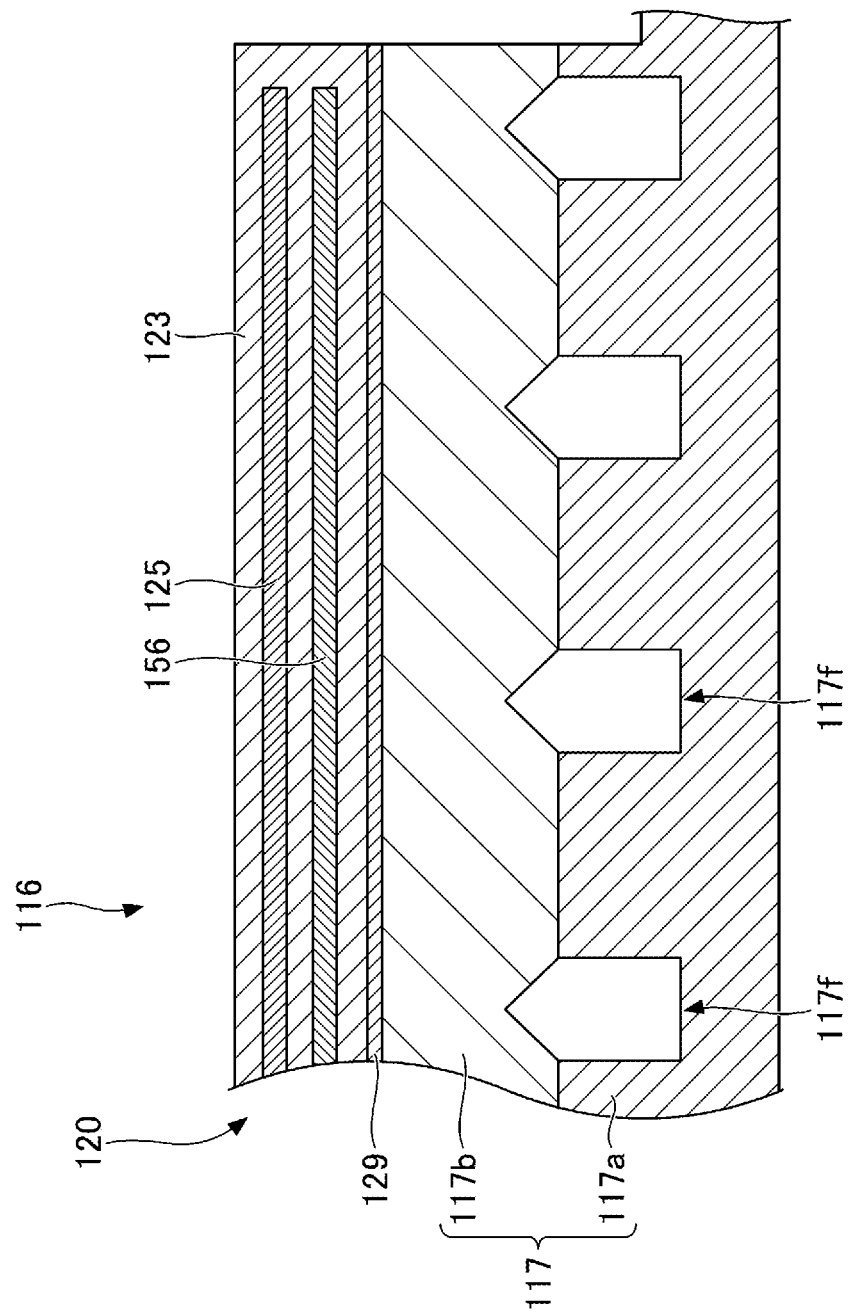
FIG. 2 is an enlarged diagram illustrating a part of a stage of a substrate processing apparatus according to an embodiment.

Hereinafter, the components of the stage 116 will be described in detail with reference to FIG. 2 in addition to FIG. 1. FIG. 2 is a cross-sectional view illustrating a part of a stage 116 of the substrate processing apparatus 100 illustrated in FIG. 1.

The stage 116 includes a base 117 and an electrostatic chuck 120. The base 117 has a first member 117a and a second member 117b. The first member 117a and the second member 117b have a sheet shape or a plate shape. Although there is no exact distinction between the sheet shape and the plate shapes, when the first member 117a and the second member 117b have a sheet shape, these members are generally thinner than those having a plate shape. The upper surface of the first member 117a and the lower surface of the second member 117b are joined to each other, and the second member 117b is joined to the electrostatic chuck 120 on the opposite side of the bonding surface to the first member 117a. Thus, the second member 117b is stacked on the top of the first member 117a, and the electrostatic chuck 120 is stacked on the top of the second member 117b.

The base 117 is supported by a support member 114 extending upwardly from the bottom of process vessel 112. The support member 114 is an insulating member, for example, formed of aluminum oxide (alumina). The support member 114 also has an approximately cylindrical shape. The first member 117a, the second member 117b, and the electrostatic chuck 120 all approximately have a disk shape about the axis Z.

A power feeder 119 is connected to the lower face of the base 117. The power feeder 119 is, for example, a feeder rod. The feeder 119 is formed of aluminum or an aluminum alloy. A first radio frequency power supply 62 is connected to the power feeder 119 via a matching box 66. A second radio frequency power feeder 64 is connected to the power feeder 119 via a matching box 68.

A flow passage 117f of a temperature control medium is formed in the base 117. The flow passage 117f extends, for example, spirally within the base 117. The temperature control medium is supplied from a chiller unit to the flow passage 117f. The temperature control medium supplied to the flow passage 117f is, in one embodiment, a refrigerant that absorbs heat by vaporization and thereby cools an object. The refrigerant may be, for example, a hydrofluorocarbon refrigerant. The flow passage 117f may be formed within at least any of the first member 117a and the second member 117b. That is, the flow passage 117f may be provided across the first member 117a and the second member 117b as illustrated in the present embodiment, or may be provided inside the second member 117b, or may be provided inside the first member 117a. However, in order to enhance the cooling performance of the electrostatic chuck 120, at least a part of the flow passage 117f is preferably formed in the second member 117b close to the electrostatic chuck 120.

The electrostatic chuck 120 includes an adsorption unit 123. The adsorption unit 123 is provided on the electrostatic chuck 120 on the second member 117b. The adsorption unit 123 has an approximate disk shape and is formed of ceramics. The ceramics forming the adsorption unit 123 can be ceramics having a volume resistivity of $1 \times 10^{15}$ Ω·cm or more in a temperature range from room temperature (for example, 20 degrees C.) to 400 degrees C. For example, aluminum oxide (alumina) may be used as the ceramics. An interface layer 129 is formed between the adsorption unit 123 and the second member 117b.

The adsorption unit 123 of the electrostatic chuck 120 contains an electrode film 125. A DC power supply is electrically connected to the electrode film 125. When the DC voltage from the DC power supply is applied to the electrode film 125, the adsorption unit 123 generates electrostatic force, such as coulombic force, thereby holding the wafer W.

The adsorption unit 123 further incorporates a heater 156. The heater 156 is positioned below the electrode film 125 of the electrostatic chuck 120. The heater 156 is connected to a heater power supply.

A fastening member 171 is formed of metal, and is formed of a material having a low thermal conductivity, for example, titanium, to inhibit thermal conduction through the fastening members 171 between the first member 117a and the second member 117b. The first member 117a is secured to the fastening member 171 by screws 173 at the periphery.

A heater 176 is provided on the fastening member 171. The heater 176 extends circumferentially and is connected to the heater power supply via a filter. The filter is disposed to prevent high frequency power from invading the heater power supply.

The heater 176 is provided between a first film 180 and a second film 182. The first film 180 is disposed on the fastening member 171 side with respect to the second film 182. The first film 180 has a thermal conductivity lower than that of the second film 182. For example, the first film 180 can be a zirconia spray film and the second film 182 can be an yttrium oxide spray film. The heater 176 can also be a tungsten spray film.

An edge ring 185 is disposed on the second film 182. The edge ring 185 is formed, for example, of silicon. The edge ring 185 is heated by heat from the heater 176. Also, much of the heat flux from the heater 176 goes toward the second film 182 rather than the first film 180, and goes toward the edge ring 185 via the second film 182. Thus, the edge ring 185 is heated efficiently.

The base 117, the fastening member 171 and the like are covered with one or more insulating films 186 on their outer periphery. The one or more insulating members 186 are formed of, for example, aluminum oxide or quartz.

[First Member and Second Member]

As described above, the base 117 of the stage 116 has a dual layer structure of a first member 117a and a second member 117b.

Figure 3:
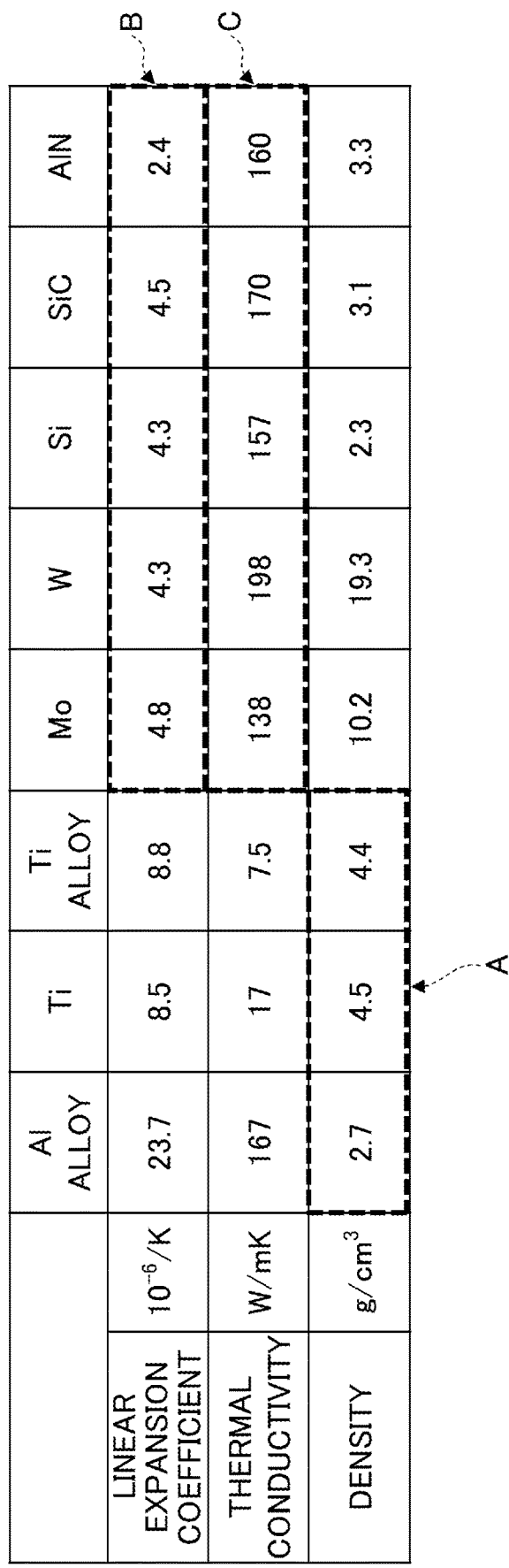
FIG. 3 is a diagram showing a physical property value of a material forming a base of a stage according to an embodiment.

The first member 117a and the second member 117b are formed of different materials. FIG. 3 illustrates a material that can be a first member 117a or a second member 117b according to an embodiment and illustrates linear expansion coefficients, thermal conductivities, and densities.

The first member 117a may be formed of, for example, aluminum, aluminum alloy, titanium, or titanium alloy as a material having a density of 5.0 g/cm³ or less. Because these materials have a density of 5.0 g/cm³ or less and are lighter than molybdenum or the like, as shown in the dotted line frame A of FIG. 3, the entire base 117 can be reduced in weight.

The lower surface of the second member 117b is bonded to the first member 117a, and the upper surface of the second member 117b is joined to the electrostatic chuck 120. As shown in the dotted line frame B, the second member 117b is formed of a material having a linear expansion coefficient of $5.0 \times 10^{-6}$/K or less, and a thermal conductivity of 100 W/mK or more, as shown in the dotted line frame C. The second member 117b may be formed of, for example, molybdenum, tungsten, silicon, silicon carbide, or aluminum nitride. These materials have a linear expansion coefficient of $5.0\times10^{-6}$/K or less, which is lower than those of titanium and the like. In addition, these materials have a thermal conductivity of 100 W/mK or more, which is higher than those of titanium and the like. As described above, the cooling performance of the second member 117b can be improved by using a material having a linear expansion coefficient of $5.0\times10^{-6}$/K or less and a thermal conductivity of 100 W/mK or more. Moreover, the entire base 117 can be made lighter by using a lightweight material having a density of 5.0 g/cm³ or less for the first member 117a.

That is, the second member 117b, which is disposed close to the electrostatic chuck 120, is formed of a material having a high cooling performance with a thermal conductivity of 100 W/mK or more. Thus, the cooling effect of the electrostatic chuck 120 can be enhanced. In addition, the second member 117b is formed of a material having a linear expansion coefficient of $5.0\times10^{-6}$/K or less. This reduces the linear expansion coefficient difference between the ceramic electrostatic chuck 120 and the second member 117b, thereby preventing the generation of friction between the electrostatic chuck 120 and the second member 117b caused by temperature variations, and thereby preventing the electrostatic chuck 120 from being broken or damaged.

Further, the first member 117a is formed of a lightweight material. Thus, the overall weight of the base 117 can be reduced. For example, tungsten (W) shown in FIG. 3 is about four times heavier than titanium, although tungsten has a higher thermal conductivity and a lower linear expansion coefficient than those of titanium. Accordingly, the base 117 having both functionality and a lightweight can be formed by using tungsten as the second member 117b to enhance the functionality relating to the thermal conductivity and the linear expansion coefficient, and by using titanium having a lightweight as the first member 117a.

According to the substrate processing apparatus 100 including a stage 116 including such a base 117, the electrostatic chuck 120 can be efficiently cooled without damaging the electrostatic chuck 120 in a wide temperature range from low to high temperatures, and a preferable plasma process can be performed on the substrate W.

[Manufacturing Method]

Figure 4:
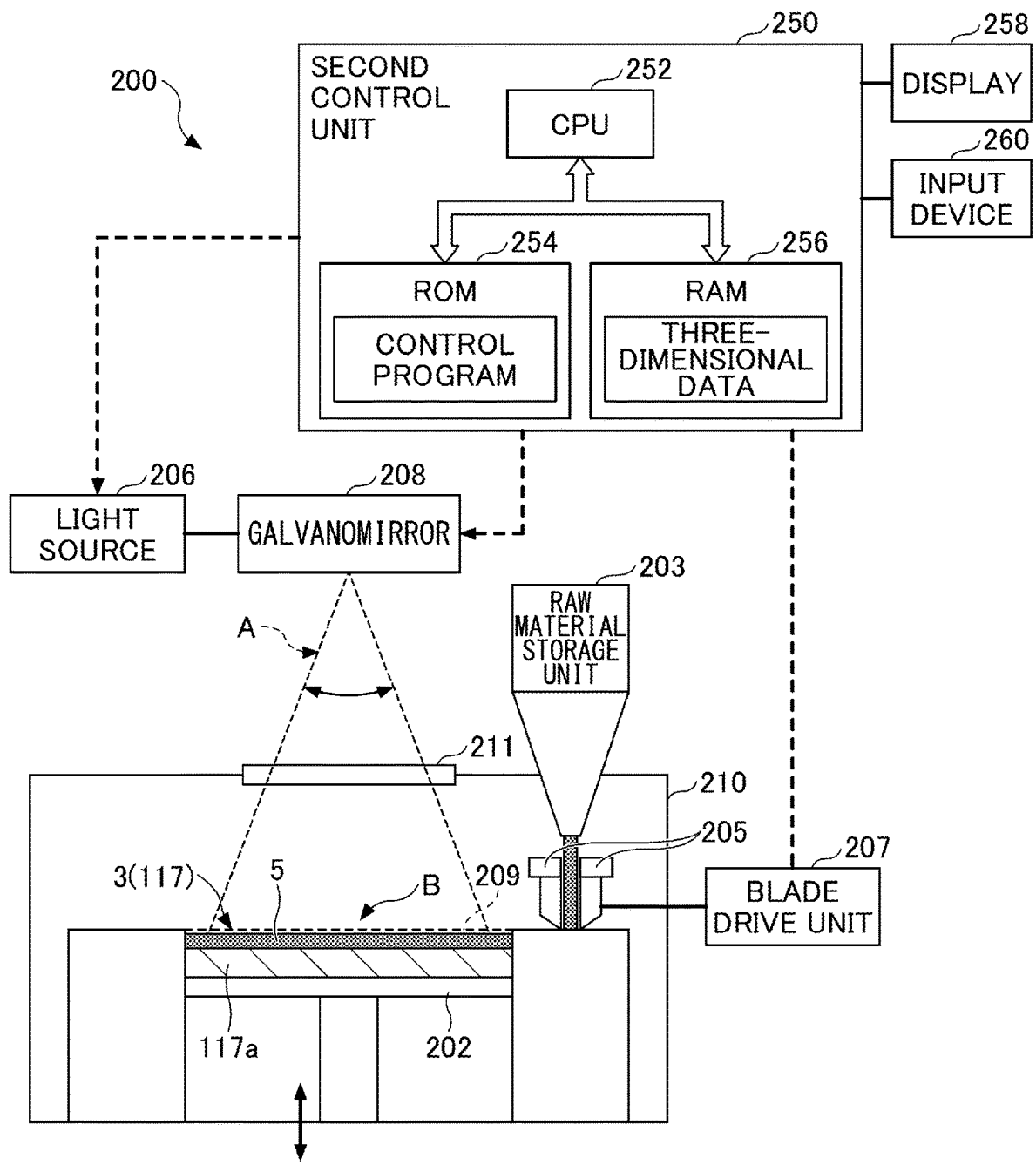
FIG. 4 is a diagram illustrating an example of a configuration of a 3D printer according to an embodiment.

Next, a method for manufacturing a base 117 according to an embodiment using a 3D printer will be described with reference to FIGS. 4 to 7. FIG. 4 is a diagram showing an example of a configuration of a 3D printer according to an embodiment. FIG. 5 is a flowchart illustrating a first method for manufacturing a base 117 according to an embodiment. FIG. 6 is a flowchart showing a second method for manufacturing a base 117 according to an embodiment. FIG. 7A schematically illustrates a base 117 formed by the first manufacturing method according to an embodiment. FIG. 7B schematically illustrates a base 117 formed by the second manufacturing method according to an embodiment.

(3D Printer Configuration)

A 3D printer 200 in accordance with this embodiment is an example of a device for forming (manufacturing) a base 117. The 3D printer 200 illustrated in FIG. 4 is used in the first and second methods for manufacturing the base 117 described below. However, the device for shaping the base 117 is not limited to the configuration of the 3D printer 200 illustrated in FIG. 4.

The 3D printer 200 can form a three-dimensional shaped structure in a chamber 210. The 3D printer 200 according to the present embodiment stores three-dimensional data for forming the base 117 as a three-dimensional shaped structure in a storage unit such as a RAM 256, and forms the base 117 based on the three-dimensional data. The base 117 is formed on a mounting surface of a stage 202 disposed like a table. The stage 202 can be raised and lowered, for example, gradually, depending on the progress of formation of the base 117.

Two blades 205 are disposed spaced apart on the table in the chamber 210. A raw material storage unit 203 is disposed above the chamber 210 and above the two blades 205. The raw material storage unit 203 stores a raw material to form a shaped article, that is, a powder material of silicon (Si) to form a second member 117b of the base 117. In the present embodiment, a first member 117a is already formed into a sheet shape or a plate shape and is disposed on the stage 202. However, the first member 117a may be also shaped by the 3D printer 200. In this case, when the first member 117a is formed of aluminum and the second member 117b is formed of silicon, the raw material storage unit 203 stores an aluminum powder and a silicon powder separately from each other.

The raw materials of the first member 117a and the second member 117b may not be limited to a powder-shaped material, but may be a wire-shaped material. The first member 117a and the second member 117b are formed of different materials from each other.

A raw material is input to a location between the two blades 205 from the raw material storage unit 203. The input raw material is pulverized using two blades 205 driven by a blade drive unit 207. A predetermined amount of a powder-shaped material (also referred to as a "powder material 5" hereinafter) is supplied to a laser beam scanning space 209. FIG. 4 illustrates the laser beam scanning space 209 on the table covered with the powder material 5.

In this manner, the powder material 5 is melted by being irradiated with an energy beam while supplying the silicon powder material 5. In the present embodiment, a laser beam A (an optical laser) is used as an energy beam to be emitted.

A light source 206 emits the laser beam A, and a galvano mirror 208 irradiates a predetermined location in an irradiation region on the stage 202 with the laser beam A by changing a direction of the emitted laser beam A via a laser transmissive window 211. The light source 206 and the galvano mirror 208 are preferably disposed outside the chamber 210.

Thus, the laser beam A can be moved in at least two-dimensional directions (XY) on the stage 202. For example, the galvano mirror 208 is controlled to move the irradiation spot of the laser beam A on the stage 202 depending on the three-dimensional data indicating the three-dimensional structure of the shaped article. Specifically, by the control of the second control unit 250, the irradiation angle is changed by the galvano mirror 208 to move the laser beam A in two-dimensional (XY) directions in accordance with the progress of the formation of the shaped article. The laser beam A melts a powder of silicon on the stage 202. The material is then cooled and solidified, and then formed into a shaped article 3. Here, the second member 117b is formed on the upper surface of the first member 117a, and the base 117 is manufactured as the shaped article 3.

While forming the second member 117b, aluminum on the upper surface of the first member 117a is also melted by the laser beam A, and at the interface between the first member 117a and the second member 117b, aluminum and silicon are mixed together.

As the formation of the base 117 by 3D printer 200 progresses, the silicon concentration with respect to aluminum forming the first member 117a increases, and the material of the second member 117b eventually becomes the shaped article having the same composition as that of the silicon powder. In this manner, the bonding surfaces of the first member 117a and the second member 117b may be formed while changing a blending proportion of the material of the first member 117a and the material of the second member 117b.

In the above description, a solid plate-shaped member that forms the first member 117a is prepared on the stage 202, and a silicon powder is supplied to the first member 117a. However, the present disclosure is not limited thereto. For example, a plate-shaped member of the second member 117b may be prepared, and an aluminum powder may be supplied to the second member 117b, thereby forming the first member 117a.

The second control unit 250 includes a CPU 252, a ROM 254, and a RAM 256. The second control unit 250 controls the supply of the raw material powder from the raw material storage unit 203 and raises and lowers the stage 202. The second control unit 250 performs control such as lighting control of the light source 206 and changes the laser irradiation angle by the galvano mirror 208. Thus, the second control unit 250 controls the operation of manufacturing the base 117.

The ROM 254 stores a control program executed by the CPU 252 therein, for example. The CPU 252 controls the manufacture of the shaped article 3 (base 117) by executing the control program, for example, based on the three-dimensional data stored in the RAM 256. The control program may be stored in a fixed recording medium, or may be detachable from various flash memories or optical (magnetic) disks and the like, and may be stored in a computer-readable recording medium.

The second control unit 250 further includes an input device 260, such as a display 258, a keyboard and a pointing device. The display 258 is used to display the progress of the formation of the base 117 and the like. The input device 260 is used to input commands for starting and stopping the forming operation of the base 117, and to control parameters at the time of setting.

The three-dimensional data are stored in a storage unit such as the RAM 256. The three-dimensional data includes data relating to the three-dimensional structure of the base 117 and various portions of the hollow structure such as the flow passage 117f within the base 117.

(First Manufacturing Method)

Next, a first manufacturing method according to the present exemplary embodiment, wherein the 3D printer 200 is operated to form the base 117, will be described with reference to FIG. 5. In the following description, aluminum is given as a material of the first member 117a and silicon is given as a material of the second member 117b, but the materials are not limited thereto.

When the present process starts, the second control unit 250 (CPU 252) acquires the three-dimensional data stored in the RAM 256 (Step S10). Next, the first member 117a formed of aluminum is disposed on the stage 202 (Step S12).

The second control unit 250 performs control of irradiating the powder with a laser beam while supplying the silicon powder to the laser beam scanning space 209 based on the three-dimensional data (Step S14). On this occasion, the second control unit 250 performs control of supplying the silicon powder that is the powder material 5 to the laser optical scanning space 209 using two blades 205 driven by the blade drive unit 207. The second control unit 250 causes the angle of the laser irradiation to be modified using the galvano mirror 208 to irradiate the silicon powder with the laser beam. The second control unit 250 repeatedly performs control of an operation of supplying silicon powder, irradiating the supplied powder with the laser beam, and melting and solidifying the supplied powder. Accordingly, the second control unit 250 completes the formation of the second member 117b by integrating the second member 117b with the first member 117a (Step S16), and the present process finishes.

(Second Manufacturing Method)

Next, a second manufacturing method according to the present embodiment, wherein the 3D printer 200 is operated to shape the base 117, will be described with reference to FIG. 6. In the second manufacturing method, the second member 117b, an inclined stack layer, and the first member 117a are shaped in that order. When the present process starts, the second control unit 250 acquires the three-dimensional data stored in the RAM 256 (Step S10).

Next, the second control unit 250 performs control of irradiating a silicon powder and an aluminum powder with a laser beam while supplying the silicon powder and the aluminum powder to the laser light scanning space 209 while changing a blending ratio between the silicon powder and the aluminum powder (Step S20). On this occasion, the second control unit 250 performs control of supplying the powder while gradually increasing the blending percentage of silicon powder from 0% to 100% based on the three-dimensional data, continuously or in a stepwise fashion. The second control unit 250 performs control of supplying the powder while gradually decreasing the blending percentage of the aluminum powder from 100% to 0% based on the three-dimensional data continuously or in a stepwise fashion.

Thus, the blending ratio between the silicon powder and the aluminum powder supplied to the laser beam scanning space 209 changes from a state of including the aluminum powder more than the silicon powder to a state of including the silicon powder more than the aluminum powder. The second control unit 250 repeatedly performs control of an operation of supplying the silicon powder and the aluminum powder mixed at a predetermined ratio to the laser beam scanning space 209, irradiating the supplied powder with a laser beam, and melting and solidifying the supplied powder. Thus, the second control unit 250 completes the formation of the first member 117a including the inclined stack layer and the second member 117b (step S22), and ends the present process.

FIG. 7A illustrates an example of a base 117 shaped according to a first manufacturing method in accordance with the present embodiment. FIG. 7B illustrates an example of a base 117 shaped according to a second manufacturing method in accordance with the present embodiment. According to these, a base 117 of a heterogeneous material including a hollow structure of an internal flow passage 117f can be formed based on the three-dimensional data.

In the first manufacturing method illustrated in FIG. 7A, a silicon powder is supplied onto the plate-shaped first member 117a, and the second member 117b is formed on the first member 117a while the silicon powder is melted with a laser beam A. At the interface between the first member 117a and the second member 117b, aluminum on the surface of the second member 117b is melted by the laser beam A to form a layer of substance (Al+Si) mixed with the molten silicon powder, but as the formation progresses, the composition becomes the same as the silicon powder. Thus, a base 117 formed of a heterogeneous material of the first member 117a and the second member 117b can be manufactured. Further, by eliminating an adhesive layer joining the first member 117a and the second member 117b together, the man-hour of manufacturing can be reduced and the lead time of manufacturing can be reduced.

In the first manufacturing method, the first member 117a may be formed on the second member 117b by supplying the aluminum powder on the plate-shaped second member 117b and melting the aluminum powder with the laser beam A. By this method, the base 117 formed of the heterogeneous material constituted of the first member 117a and the second member 117b illustrated in FIG. 7A can be also manufactured.

In the second manufacturing method illustrated in FIG. 7B, a base 117 including an inclined stack layer 117c formed between the first member 117a and the second member 117b is formed. In the second manufacturing method, to begin with, only the aluminum powder is supplied, and the first member 117a is shaped while the aluminum powder is melted with the laser beam A. Next, the blending percentage of the aluminum powder is gradually reduced from 100% to 0%, the blending percentage of the silicon powder is gradually increased from 0% to 100%, and the inclined stack layer 117c is shaped while melting the aluminum powder and the silicon powder with the laser beam A. Finally, only the silicon powder is supplied and the second member 117b is shaped while the silicon powder is melted with the laser beam A.

Thus, the inclined stack layer 117c is formed between the first member 117a and the second member 117b by varying the blending percentage of the materials of each member. In this case, by forming the inclined stack layer 117c by gradually changing the blending percentage of the different materials, the heat transfer between the different materials can be improved, and the temperature controllability can be further improved. Further, by eliminating the adhesive layer joining the second member 117b to the first member 117a, the man-hour of manufacturing can be reduced and the lead time of manufacturing can be reduced.

In the second manufacturing method, the second member 117b, the inclined stack layer 117c, and the first member 117a may be formed in this order. The inclined stack layer 117c may also be formed into an inclined shape by linearly changing the blending percentage of the aluminum powder and the silicon powder, or may be formed in a stepwise manner.

The 3D printer 200 is not limited to a 3D printer having such a configuration. For example, the 3D printer may be a directional energy type 3D printer or may be a 3D printer using other methods. In addition to the aforementioned laser beam, the energy source may be a method for applying kinetic energy to an electron beam or particles. Examples of 3D printers using other methods include a bonding agent injection type 3D printer, a sheet stack type 3D printer, a photo-polymerizing (photo-forming) type 3D printer, a material extrusion (heat-melting lamination) type 3D printer, and a cold spray type 3D printer.

(Third Manufacturing Method)

Figure 8A:
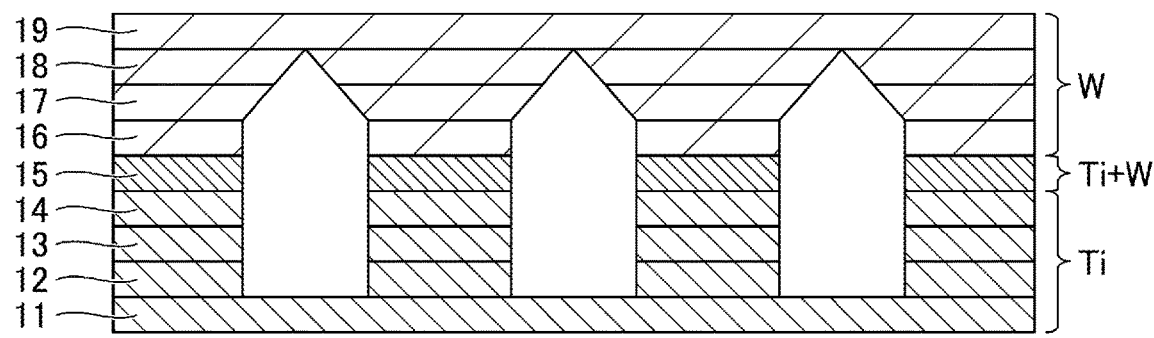
FIGS. 8A and 8B are diagrams schematically illustrating a third method for manufacturing a base and a shaped base according to an embodiment.
Figure 8B:
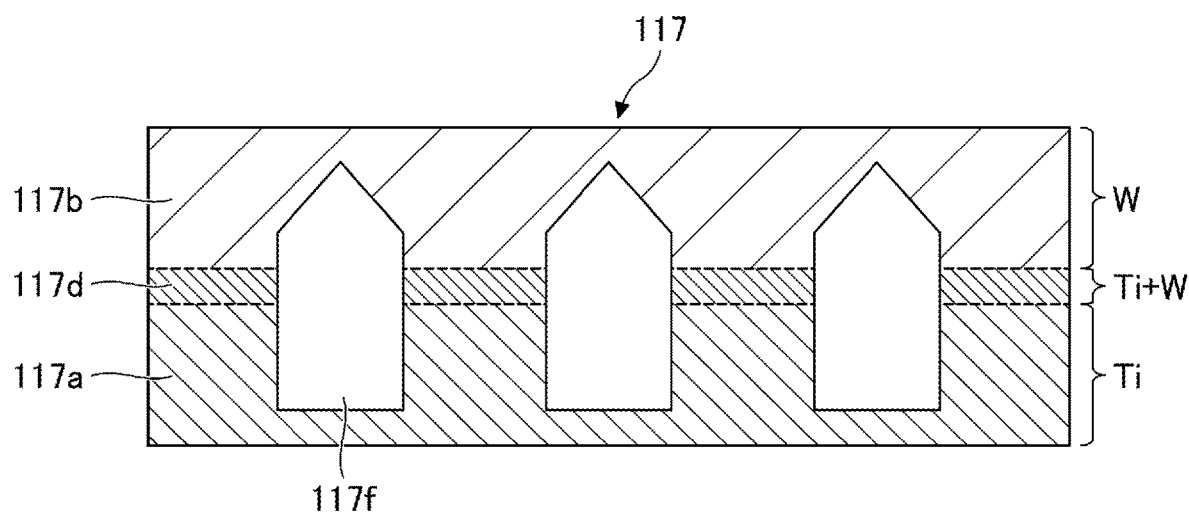

Next, a third manufacturing method for forming a base 117 using diffusion bonding according to the present embodiment will be described with reference to FIGS. 8A and 8B. FIGS. 8A and 8B schematically illustrate a process of a third method for manufacturing a base 117 and a manufactured base 117 according to an embodiment. In the following description, titanium is given as the material for the first member 117a, and tungsten is given as the material for the second member 117b. However, the materials are not limited thereto.

In the third manufacturing method, as illustrated in FIG. 8A, titanium sheet-shaped members 12 to 14 with flow passages formed therein are stacked in sequence on a titanium sheet-shaped or plate-shaped member 11. Next, a sheet-shaped member 15 made of a titanium-tungsten mixing material including a flow passage formed therein is stacked on the sheet-shaped member 14.

Next, tungsten sheet-shaped members 16 to 18 including flow passages formed therein, are stacked. Next, the tungsten sheet-shaped or plate-shaped member 19 is stacked. Under this condition, diffusion bonding is carried out, and the whole is crimped while being heated. As illustrated in FIG. 8B, the interfaces of all sheet-shaped or plate-shaped members are crimped together and integrated. As a result, a base 117 including the first member 117a, the intermediate layer 117d, and the second member 117b integrated together is manufactured.

In the third manufacturing method, the second member 117b, the intermediate layer 117d, and the sheet-shaped or plate-shaped member 117a of the first member 117a may be stacked in this order to perform the diffusion bonding. On this occasion, the sheet-shaped or plate-shaped member constituting the first member 117a prior to the diffusion bonding may be either a plurality of layers or a single layer. Similarly, the sheet-shaped or plate-shaped members constituting the intermediate layer 117d and the second member 117b may be either a plurality of layers or a single layer, respectively.

There may be no intermediate layer 117d. However, by disposing the intermediate layer 117d made of a mixture material of the first member 117a and the second member 117b between the first member 117a and the second member 117b, a bonding property between the first member 117a and the second member 117b can be improved, and the thermal conductivity can be further increased. In particular, the intermediate layer 117d is preferably disposed when compositions having poor bonding properties are used as the material of the first member 117a and the material of the second member 117b.

As described above, by forming the base 117 of the stage 116 according to the present embodiment from the first member 117a and the second member 117b of the different material satisfying a desired condition, it is possible to provide the stage 116 having a good thermal conductivity, a low linear expansion coefficient, and a lightweight. Accordingly, it is possible to prevent cracking of the electrostatic chuck 120 and to improve the heat release of the electrostatic chuck 120, thereby increasing the temperature controllability of the substrate W.

The stage and substrate processing apparatus according to an embodiment disclosed herein should be considered exemplary in all respects and are not limited thereto. The above embodiments may be changed and modified in various forms without departing from the appended claims and spirit thereof. The matters described in the above embodiments may take other configurations to the extent not inconsistent, and may be combined to the extent not inconsistent.

The substrate processing apparatus of the present disclosure is applicable to any of the following types of apparatuses: Atomic Layer Deposition (ALD) apparatuses, Capacitively Coupled Plasma (CCP) apparatuses, Inducibly Coupled Plasma (ICP) apparatuses, Radial Line Slot Antenna (RLSA) apparatuses, Electron Cyclotron Resonance Plasma (ECR) apparatuses, and Helicon Wave Plasma (HWP) apparatuses.

The substrate processing apparatus is not limited to an etching apparatus, but may include a film deposition apparatus, an ashing apparatus, a doping apparatus and the like, as long as plasma is used to perform a predetermined process (for example, film formation, etching, or the like) on a substrate.

Thus, as discussed above, according to an embodiment of the present disclosure, a stage having a preferable conductivity, a low linear expansion coefficient, and a lightweight.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A stage, comprising:
   a first member made of a first material having a density of 5.0 g/cm$^3$ or less;
   a second member joined to the first member and made of a second material having a linear expansion coefficient of $5.0 \times 10^{-6}$/K or less and a thermal conductivity of 100 W/mK or more;
   a layer located between the first member and the second member, the layer being directly adjacent to both of the first and second members with no gap therebetween, wherein a composition ratio of the first material and the second material changes in a linear manner or a stepwise manner throughout the layer from the first member towards the second member; and
   a flow passage for a temperature control medium formed in both of the first member and the second member, the flow passage being provided across the first member, the layer and the second member.

2. The stage as claimed in claim 1, wherein the second member is joined to an electrostatic chuck on an opposite side of a bonding surface to the first member.

3. The stage as claimed in claim 1, wherein the first member is made of any one of aluminum, an aluminum alloy, titanium, and a titanium alloy.

4. The stage as claimed in claim 1, wherein the second member is made of any one of molybdenum, tungsten, silicon, silicon carbide, and aluminum nitride.

5. The stage as claimed in claim 1, wherein a cross-sectional shape of the flow passage includes two sides extending in a direction from the first member toward the second member and a vertex where the two sides meet, the vertex being situated in the second member.

6. The stage as claimed in claim 1, wherein the stage is manufactured by a 3D printing process.

7. A substrate processing apparatus, comprising:
   a chamber;
   a stage disposed in the chamber and configured to support a substrate, the stage including:
   a first member made of a first material having a density of 5.0 g/cm$^3$ or less;
   a second member joined to the first member and made of a second material having a linear expansion coefficient of $5.0 \times 10^{-6}$/K or less and a thermal conductivity of 100 W/mK or more;
   a layer located between the first member and the second member, the layer being directly adjacent to both of the first and second members with no gap therebetween, wherein a composition ratio of the first material and the second material changes in a linear manner or a stepwise manner throughout the layer from the first member towards the second member; and
   a flow passage for a temperature control medium formed in both of the first member and the second member, the flow passage being provided across the first member, the layer and the second member.

8. The substrate processing apparatus as claimed in claim 7, wherein a cross-sectional shape of the flow passage includes two sides extending in a direction from the first member toward the second member and a vertex where the two sides meet, the vertex being situated in the second member.

* * * * *